(12) United States Patent
Silvestri et al.

(10) Patent No.: US 9,735,136 B2
(45) Date of Patent: Aug. 15, 2017

(54) METHOD FOR EMBEDDING SILICON DIE INTO A STACKED PACKAGE

(75) Inventors: Paul Silvestri, Meridian, ID (US); Jonathon G. Greenwood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 963 days.

(21) Appl. No.: 12/400,632

(22) Filed: Mar. 9, 2009

(65) Prior Publication Data
US 2010/0224976 A1 Sep. 9, 2010

(51) Int. Cl.
*H01L 25/18* (2006.01)
*H01L 25/065* (2006.01)
*H01L 23/14* (2006.01)
*H01L 23/13* (2006.01)
*H01L 23/31* (2006.01)

(52) U.S. Cl.
CPC ............ *H01L 25/18* (2013.01); *H01L 23/142* (2013.01); *H01L 25/0657* (2013.01); *H01L 23/13* (2013.01); *H01L 23/3128* (2013.01); *H01L 2224/4824* (2013.01); *H01L 2225/0651* (2013.01); *H01L 2225/06541* (2013.01); *H01L 2225/06555* (2013.01); *H01L 2225/06575* (2013.01); *H01L 2924/10253* (2013.01); *H01L 2924/15311* (2013.01)

(58) Field of Classification Search
CPC ....... H01L 2224/97; H01L 2224/32145; H01L 24/97; H01L 25/0657; H01L 23/142
USPC ............... 257/685, 686, 698, E29.324, 777, 257/E21.705
See application file for complete search history.

(56) References Cited

U.S. PATENT DOCUMENTS

| | | | |
|---|---|---|---|
| 6,469,376 B2 | 10/2002 | Vaiyapuri | |
| 6,639,309 B2 * | 10/2003 | Wallace | 257/678 |
| 6,798,049 B1 * | 9/2004 | Shin et al. | 257/678 |
| 6,833,619 B1 * | 12/2004 | Jang et al. | 257/728 |
| 7,190,064 B2 * | 3/2007 | Wakabayashi et al. | 257/691 |
| 7,446,420 B1 * | 11/2008 | Kim | 257/777 |
| 7,911,065 B2 * | 3/2011 | Suh | 257/777 |
| 2007/0158811 A1 * | 7/2007 | Wehrly et al. | 257/686 |
| 2008/0054435 A1 * | 3/2008 | Mehta et al. | 257/686 |

\* cited by examiner

*Primary Examiner* — Jesse Y Miyoshi
(74) *Attorney, Agent, or Firm* — Perkins Coie LLP

(57) ABSTRACT

Several embodiments of microelectronic configurations with logic components and associated methods of manufacturing are disclosed herein. In one embodiment, the configuration includes a substrate with a recess, a first die carried by the substrate wherein the die substantially covers the recess, and a logic component carried by the die in a location exposed by the recess. The logic component can be substantially coplanar with the substrate. The die is electrically connected to a terminal on a one side of the substrate, and the logic component is electrically connected to a terminal on an opposite side of the substrate.

19 Claims, 3 Drawing Sheets

METHOD FOR EMBEDDING SILICON DIE INTO A STACKED PACKAGE

TECHNICAL FIELD

The present disclosure is related to microelectronic devices with logic components and associated methods of manufacturing.

BACKGROUND

Microelectronic dies are typically manufactured on semiconductor wafers or other types of workpieces using sophisticated equipment and processes. The individual dies generally include a plurality of bond-pads coupled to integrated circuits. The bond-pads provide external contacts through which data signals, supply voltage, and other electrical signals are transmitted to and from the integrated circuits. Demand for these components requires ever higher performance and smaller packaging. To meet this demand, it has become common practice to stack dies to achieve more memory or computing power in the same unit of space or footprint. This technique reduces the footprint of the devices but increases the height of the package. The same demand for small, powerful devices limits the effectiveness of this technique beyond a certain height threshold depending on the device and its use. Another adverse effect of taller die packages is the increased latency caused by the necessarily longer wirebonds between the upper die(s) and the lead frame or interposer substrate.

Most current packaged devices have a logic component that adds functionality not found in earlier microelectronic packages. However, adding a logic component to a stack of dies adds another die that further increases the height of the die stack. FIG. 1 depicts a device 100 with an interposer substrate 104, a first die 106a attached to the interposer substrate 104, and a second die 106b stacked on the first die 106a. The dies 106a-b are electrically connected to the substrate 104 by wirebonds 108 that extend between bond pads 112 on the substrate 104 and bond pads 113 on the dies 106a-b. The device 100 also has a logic component 114 on top of the second die 106b that is electrically connected to the substrate 104 by additional wirebonds 116. As more dies and other layers are stacked onto each other the distance increases between the substrate 104 and both the upper die (e.g., die 106b) and the logic component 114. This increases both the length of the wirebonds 108 and 116, which also increases the latency in the electrical signals and the height of the die stack. Both the height of the device 100 and the length of the wirebonds 108 and 116 affect the performance and viability of devices.

FIG. 2 illustrates another existing device 200 with a substrate 202 and multiple dies 204 stacked on the substrate 202. The dies 204 have through silicon vias ("TSVs") 206 that interconnect the dies 204 to each other and to the substrate 202, and a logic component 208 is attached to the bottom of the substrate 202 and electrically coupled to the dies 204 and substrate 202 by interlayer wiring 210. The TSVs mitigate latency problems in large die stacks, but TSVs are more expensive than wirebonds. In light of the existing devices 100 and 200, there is a need for cost-effective structural arrangements that can reduce both the latency and overall size of microelectronic device packages.

DETAILED DESCRIPTION

Specific details of several embodiments of the new technology are described below with reference to microelectronic device configurations with logic components and associated methods of manufacturing. Typical microelectronic device packages include microelectronic circuitry or components, thin-film recording heads, data storage elements, micro fluidic devices, and other components manufactured on microelectronic substrates. Micromachines and micromechanical devices are included within this definition because they are manufactured using technology similar to that used in the fabrication of integrated circuits. The term "microfeature substrate" or "die" is used throughout to include semiconductor substrates and other types of substrates upon which and/or in which semiconductor devices, other types of microelectronic devices, micromechanical devices, data storage elements, read/write components, and other features are fabricated. Suitable materials for dies can include semiconductor pieces (e.g., doped silicon wafers or gallium arsenide wafers), non-conductive pieces (e.g., various ceramic substrates), or conductive pieces. Microfeature dies can also include one or more layers (e.g., conductive, semiconductive, and/or dielectric) that are situated upon and/or within one another. These layers can include or form a wide variety of electrical components, mechanical components, and/or systems of such components (e.g., integrated circuits, memory devices, processors, imagers, micromechanical systems, etc.). The term "surface" can encompass planar and nonplanar surfaces of a semiconductor substrate with or without patterned and non-patterned features. A person skilled in the relevant art will also understand that the new technology may have additional embodiments, and that the new technology may be practiced without several of the details of the embodiments described below with references to FIGS. 3-6.

In several embodiments of the new technology, the microelectronic device comprises an interposer substrate with first bond pads on a first side of the interposer substrate, wherein the interposer substrate is formed with a recess extending from the first side to the second side. The microelectronic device also includes a die stack comprising a plurality of dies in a stack, wherein a base die is attached to the first side of the interposer substrate such that at least a portion of a surface of the base die is exposed by the recess. A logic component is attached to the surface of the base die exposed through the recess such that the logic component is positioned at least substantially between the first side of the interposer substrate and the second side of the interposer substrate.

Figure 3:
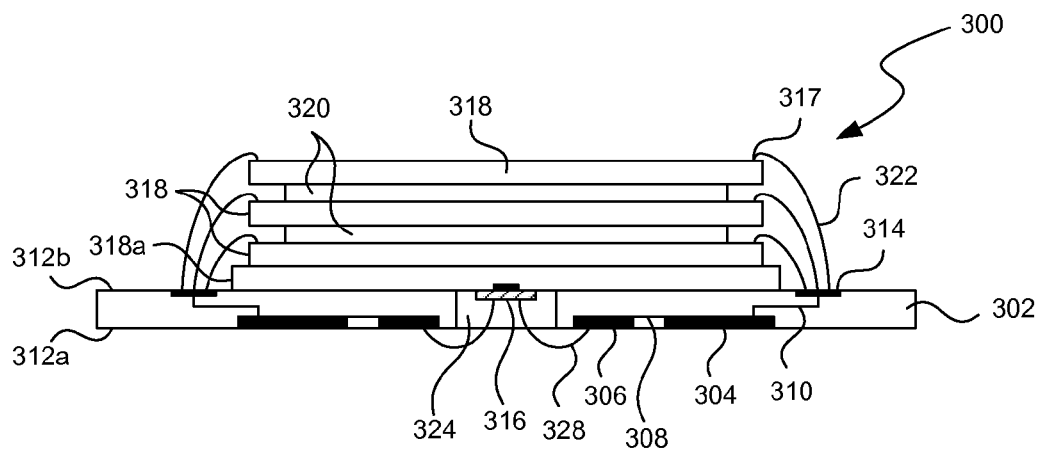
FIG. 3 is a partially schematic cross-sectional view of a microelectronic device in accordance with an embodiment of the new technology.

FIG. 3 is a partially schematic cross-sectional view of a microelectronic device 300 with multiple dies 318 and a logic component 316 in a stacked arrangement according to one embodiment of the new technology. As shown in FIG. 3, the microelectronic device 300 can have an interposer substrate 302 including a first side 312a, a second side 312b, ball pads 304, first bond pads 306 at the first side 312a, and second bond pads 314 at the second side 312b. The interposer substrate 302 can also include printed circuitry 308 that electrically connects the ball pads 304 to corresponding first bond pads 306, and wiring 310 that electrically connects the ball pads 304 to corresponding second bond pads 314. The wiring 310 is formed using processes for manufacturing printed circuit boards. The ball pads 304 provide electrical communication between the microelectronic device 300 and other electrical contacts of a larger printed circuit board to which the microelectronic device 300 is attached. The interposer substrate 302 shown in FIG. 3 further includes a recess 324, such as a slot or other opening through the interposer substrate 302, which can be located between the first bond pads 306.

The dies 318 can include a base die 318a attached to the second side 312b of the interposer substrate 302 using an adhesive tape, adhesive paste or another suitable attachment mechanism. Additional dies 318 can be stacked on the base die 318a. The dies 318 can be made of silicon or any other suitable material, and can be a memory device (e.g., DRAM) or other electronic and/or mechanical component (e.g., a NAND stack). Although FIG. 3 shows three dies 318, a person of ordinary skill in the art will appreciate that the number of dies 318 depends on the application and requirements of the device. The dies 318 can be separated by spacers 320 positioned between adjacent dies 318 so that wirebonds 322 can be attached to die bond pads 317 on individual dies 318. The spacers 320 can be blank silicon chips, tape, or other suitable items. In another application, a spacer is placed between only selected dies, or in other applications all of the dies 318 can be attached directly to one another without being separated by spacers. The type, layout, and spacing of the spacers 320 can be determined according to the requirements of a given application. For example, the height of the stack of dies 318 and spacers 320 can affect the time it takes electrical signals to pass along the wirebonds 322 (i.e., the latency). In general, and all other things being equal, shorter wirebonds provide a faster response and lower latency than longer wirebonds. Thus, the length of the wirebonds 322 for the upper dies in tall die stacks is an important factor in providing the desired latency and concomitant performance.

Figure 1:
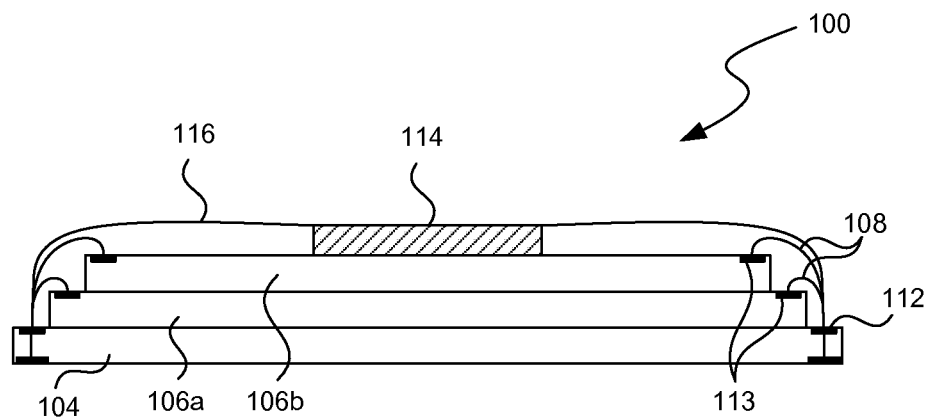
FIG. 1 is a partially schematic cross-sectional view of a microelectronic device in accordance with the prior art.
Figure 2:
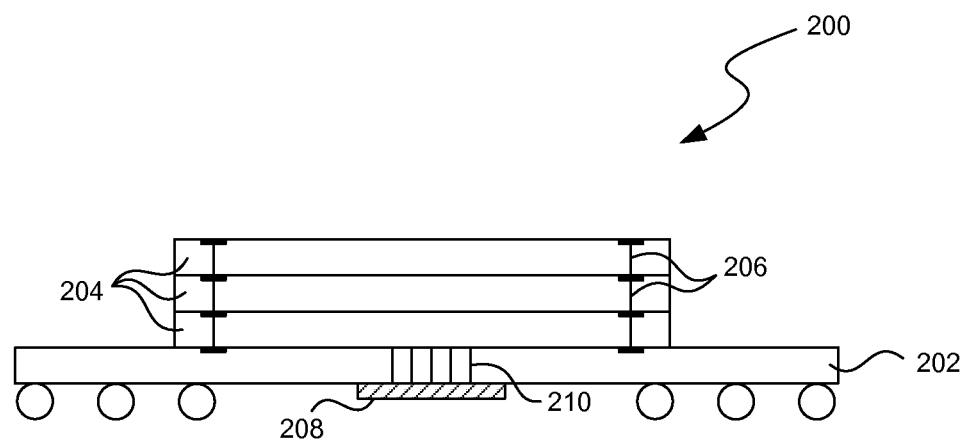
FIG. 2 is a partially schematic cross-sectional view of a microelectronic device in accordance with the prior art.

The logic component 316 can be located in the recess 324 through the interposer substrate 302. In this embodiment, the logic component 316 is attached to the base die 318a which is adjacent the second side 312b of the interposer substrate 302. This embodiment of the microelectronic device 300 reduces the stack height and latency compared to the device shown in FIG. 1 because the placement of the logic component 316 in recess the 324 does not increase the height of the device 300. Additionally, the wirebonds 328 for the logic component 316 can pass through the recess 324 to electrically connect the logic component 316 to the first bonds pads 306. The recess 324 can be formed in any shape, size, and location that can contain the logic component 316 and the wirebonds 328. As a result, the embodiment of the microelectronic device 300 shown in FIG. 3 provides a compact arrangement that can fit into small enclosures and use short wirebonds 328 for the logic component 316.

In several other embodiments of the new technology, the microelectronic device comprises an interposer substrate having a first side and a second side, and a recess open at the second side. The recess can be a through hole passing completely through the interposer substrate, or the recess can be a blind hole extending a distance into the interposer substrate without penetrating the opposing side of the substrate. The microelectronic device also includes a plurality of second terminals at the second side. One or more individual dies are attached to the first side of the interposer substrate, and the dies include integrated circuitry and bond sites electrically connected to the first terminals of the interposer substrate. A logic component can be positioned in the recess of the interposer substrate, located between the first side and second side of the interposer substrate, and electrically connected to the second terminals at the second side.

Several embodiments of methods for assembling a microelectronic device package comprises forming an interposer substrate with a recess, and attaching a die structure to a one side of the interposer substrate. The recess can be a blind hole or a through hole. The method continues by attaching a logic component to the microelectronic device package such that at least a portion of the logic component is positioned between the one side of the interposer substrate and an opposite side of the interposer substrate, and such that at least a portion of the logic component is accessible through the recess on the opposite side. The method also includes electrically connecting the die structure and the logic component to bond pads on the interposer substrate.

Figure 4:
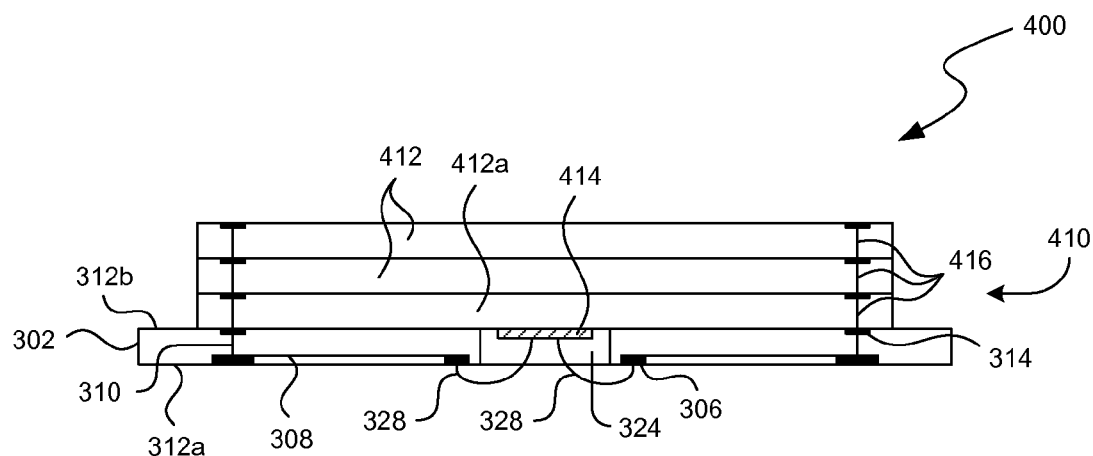
FIG. 4 is a partially schematic cross-sectional view of a microelectronic device in accordance with another embodiment of the new technology.

FIG. 4 is a partially schematic cross-sectional view of an embodiment of another microelectronic device 400, and like reference numbers refer to like components in FIGS. 3 and 4. In this embodiment, the microelectronic device 400 includes the interposer substrate 302, a die stack 410 having one or more dies 412 and a logic component 414, and through-silicon-vias (TSVs) 416. One of the dies is a base die 412a attached to the second side 312b of the interposer substrate 302. The TSVs 416 electrically couple the dies 412 to each other and/or the interposer substrate 302 to transmit the electrical signals and voltages to/from the dies 412.

The logic component 414 is attached to the base die 412a. The logic component 414 is positioned in the recess 324 and electrically connected to the second bond pads 306 by wirebonds 328. This configuration enables a shorter overall package compared to conventional designs because the logic component 414 is located in the recess 324 instead of on top of the die stack 410. In addition, the short wirebonds 328 to the logic component 414 have a low latency. Thus, the device 400 according to this embodiment achieves good performance from a small device.

Figure 5:
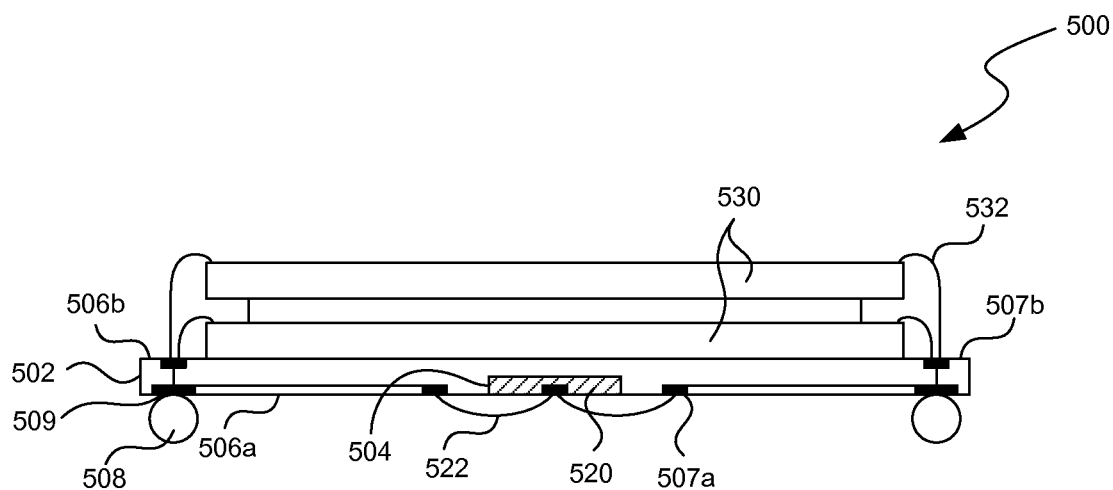
FIG. 5 is a partially schematic cross-sectional view of a microelectronic device in accordance with a further embodiment of the new technology.
Figure 6:
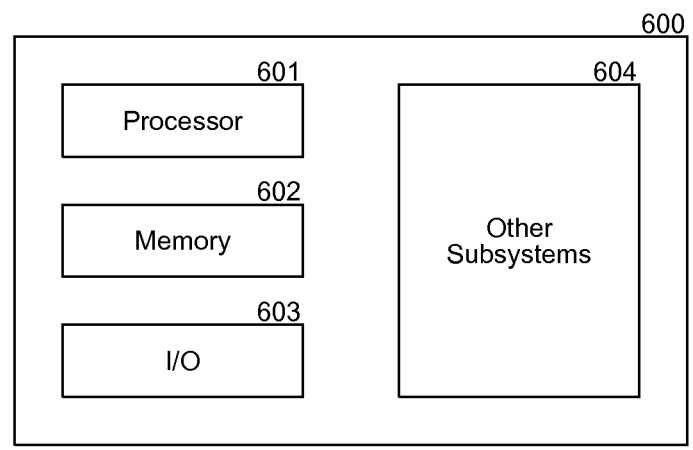
FIG. 6 is a schematic diagram of a system that includes one or more microelectronic device packages in accordance with embodiments of the new technology.

FIG. 5 is a partially schematic cross-sectional view of a microelectronic device 500 in accordance with a further embodiment of the new technology. The device 500 includes an interposer substrate 502 having a first side 506a, a second side 506b, and a recess defined by a blind hole 504 extending from the first side 506a of the interposer substrate 502 to an intermediate depth within the interposer substrate 502. The blind hole 504 does not extend completely through to the second side 506b of the substrate 502. The depth of the blind hole 504 depends upon the design constraints and preferences of a given application, and can extend through the substrate 502 a greater or lesser distance than what is shown in FIG. 5. It is understood by a person of ordinary skill in the art that previous embodiments discussed above with reference to FIGS. 3 and 4, which include an opening passing completely through a substrate, can alternatively include a blind hole similar to the blind hole 504 discussed with reference to FIG. 5. Accordingly, the various configurations and features previously discussed can be implemented with a blind hole or a through hole without departing from the scope of the present disclosure.

The microelectronic device 500 further includes a logic component 520 positioned in the blind hole 504 and attached to the interposer substrate 502. The dimensions of the blind hole 504 can vary both in depth and width to accommodate logic components of varying sizes. For example, the blind hole 504 can be sized according to the size of the logic component 520 such that the logic component 520 is substantially flush with the first side 506a of the substrate 502, but in other examples a portion of the logic component can extend below the first side 506a of the substrate 502 by a distance that is less than the distance a solder ball 508 or other connector projects away from a ball pad 509. The logic component 520 is electrically connected to bond pads 507a by wirebonds 522.

The microelectronic device can also include one or more dies 530 stacked on the second side 506b of the substrate and connected to bond pads 507b by wire bonds 532. As described above, the dies 530 can include any number, type, and configuration of dies depending on the application of the device 500. This configuration provides a short, compact microelectronic device design because the logic component 520 is positioned, at least in part, between the first side 506a and the second side 506b of the interposer substrate 502. Also, the length of the wirebonds is reduced, which correspondingly reduces the latency of the device 500.

Individual microelectronic device packages may be incorporated into myriad larger and/or more complex systems. A representative system 600 is shown schematically in FIG. 6. The system 600 can include a processor 601, a memory 602, input/output devices 603, and/or other subsystems or components 604. The resulting system 600 can perform a wide variety of computing, processing, storage, sensor, and/or other functions. Accordingly, the representative system 600 can include, without limitation, computers and/or other data processors, for example, desktop computers, laptop computers, Internet appliances, and hand-held devices (e.g., palmtop computers, wearable computers, cellular or mobile phones, multi-processor systems, processor-based or programmable consumer electronics, network computers, mini computers). The representative system 600 can also include servers and associated server subsystems, display devices, and/or memory devices. Components of the system 600 may be housed in a single unit or distributed over multiple, interconnected units, e.g., through a communications network. Components can accordingly include local and/or remote memory storage devices and any of a wide variety of computer-readable media, including magnetic or optically readable or removable computer disks.

From the foregoing, it will be appreciated that specific embodiments of the invention have been described herein for purposes of illustration, but well-known structures and functions have not been shown or described in detail to avoid unnecessarily obscuring the description of the embodiments of the invention. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list.

From the foregoing, it will be appreciated that specific embodiments described above are for purposes of illustration and that various modifications may be made without deviating from the invention. Aspects of the disclosure described in the context of particular embodiments may be combined or eliminated in other embodiments. Further, while advantages associated with certain embodiments of the disclosure may have been described in the context of those embodiments, other embodiments may also exhibit such advantages, but not all embodiments need necessarily exhibit such advantages to fall within the scope of the disclosure. Accordingly, the present invention is not limited to the embodiments described above, which were provided for ease of understanding, but rather the invention includes any and all other embodiments defined by the claims.

We claim:

1. A microelectronic device, comprising:
an interposer substrate having a first side and a second side, a recess open at the first side and extending partially, but not completely, through the interposer substrate, the recess having a base and recess sidewalls at least generally transverse to the first side, the interposer substrate further having a plurality of first terminals at the first side, and a plurality of second terminals at the second side;
one or more individual dies attached to the second side of the interposer substrate, the one or more individual dies having integrated circuitry and bond sites electrically connected to the second terminals of the interposer substrate; and
a logic component having a major surface and logic component sidewalls at least generally transverse to the major surface, the logic component being in the recess at the first side of the interposer substrate and attached to the base of the recess of the interposer substrate, the logic component is electrically connected to the second terminals at the second side,
wherein—
the base has a first width between the recess sidewalls,
the major surface has a second width between the logic component sidewalls, and
the first width is generally the same as the second width.

2. The microelectronic device of claim 1 wherein the one or more individual dies form a die structure comprising a plurality of dies attached to the first side of the interposer substrate.

3. The microelectronic device of claim 1 wherein the recess is centrally located on the interposer substrate.

4. The microelectronic device of claim 1 wherein the dies are electrically connected to the second terminals at the second side by wirebonds.

5. The microelectronic device of claim 1 wherein the one or more individual dies comprise a plurality of dies comprising a NAND stack, and the logic component comprises a controller.

6. The microelectronic device of claim 1, further comprising a spacer between at least two of the individual dies.

7. The microelectronic device of claim 1 wherein the first terminal and the second terminal are electrically connected by interlayer wiring.

8. The microelectronic device of claim 1, wherein the logic component is at least flush with the first side of the interposer substrate.

9. The microelectronic device of claim 1, wherein the logic component is flush with the first side of the interposer substrate.

10. The microelectronic device of claim 1 wherein a portion of the logic component projects outside of the recess and beyond the interposer substrate.

11. The microelectronic device of claim 1 wherein:
the bond sites are first bond sites;
the logic component includes second bond sites; and
the microelectronic device further comprises wirebonds connecting the first terminals to the second bond sites, wherein the wirebonds connect to the second bond sites at a location outside of the recess.

12. The microelectronic device of claim 1 wherein:
the bond sites are first bond sites;
a portion of the logic component projects outside of the recess and beyond the interposer substrate;
the portion of the logic component includes second bond sites; and
the microelectronic device further comprises wirebonds connecting the first terminals to the second bond sites.

13. A microelectronic device, comprising:
an interposer substrate with first bond pads on a first side of the interposer substrate and second bond pads on a second side of the interposer substrate, wherein the interposer substrate has a first thickness and is formed with a recess extending from the first side to an intermediate depth in the interposer substrate, and wherein the recess has a first planform area;
a die stack comprising a plurality of dies in a stack, wherein a base die is attached to the second side of the interposer substrate;
a logic component having a second planform area that is generally the same as the first planform area, the logic component being attached in the recess, wherein the logic component is positioned between the first side of the interposer substrate and the second side of the interposer substrate;
an electrical pathway between the dies and first bond pads on the first side of the interposer substrate; and
wirebonds electrically connecting the logic component to the first bond pads on the first side of the interposer substrate.

14. The microelectronic device of claim 13 wherein the electrical pathway between the dies and first bond pads comprises wirebonds.

15. The microelectronic device of claim 13, further comprising spacers between the plurality of dies.

16. The microelectronic device of claim 13 wherein the die stack comprises at least one memory device.

17. The microelectronic device of claim 13, wherein the logic component is at least flush with the first side of the interposer substrate.

18. The microelectronic device of claim 13, wherein the logic component is flush with the first side of the interposer substrate.

19. A microelectronic device, comprising:
an interposer substrate having a first side, a second side, a plurality of first terminals at the first side, and a plurality of second terminals at the second side, wherein—
the interposer substrate includes a recess open at the first side and extending partially, but not completely, through the interposer substrate, and
the recess includes a base and a recess sidewall at least generally transverse to the first side;
one or more individual dies attached to the second side of the interposer substrate, the one or more individual dies having integrated circuitry and bond sites electrically connected to the second terminals of the interposer substrate; and
a logic component in the recess at the first side of the interposer substrate and attached to the base of the recess of the interposer substrate, wherein—
the logic component is electrically connected to the second terminals at the second side,
the logic component includes a major surface and a logic component sidewall at least generally transverse to the major surface,
the major surface and the base have generally similar dimensions, and
the logic component sidewall and the recess sidewall have generally similar dimensions.

\* \* \* \* \*